United States Patent
Lin et al.

(10) Patent No.: US 11,074,942 B2
(45) Date of Patent: Jul. 27, 2021

(54) STORAGE SYSTEM

(71) Applicant: HONGFUJIN PRECISION ELECTRONICS(TIANJIN)CO., LTD., Tianjin (CN)

(72) Inventors: Jia-Feng Lin, New Taipei (TW); Chieh-Hsiang Lin, New Taipei (TW); Wen-Chen Wang, New Taipei (TW); Chih-Hung Kuo, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/549,137

(22) Filed: Aug. 23, 2019

(65) Prior Publication Data

US 2021/0043231 A1 Feb. 11, 2021

(30) Foreign Application Priority Data

Aug. 5, 2019 (CN) .......................... 201910718508.8

(51) Int. Cl.
*H05K 5/00* (2006.01)
*G11B 33/02* (2006.01)
*H05K 5/02* (2006.01)

(52) U.S. Cl.
CPC .......... *G11B 33/022* (2013.01); *H05K 5/0004* (2013.01); *H05K 5/0017* (2013.01); *H05K 5/0247* (2013.01)

(58) Field of Classification Search
CPC .. G11B 33/022; H05K 5/0004; H05K 5/0017; H05K 5/0247; H05K 7/14
See application file for complete search history.

(56) References Cited

U.S. PATENT DOCUMENTS

| | | | |
|---|---|---|---|
| 6,411,520 B1 * | 6/2002 | Hauke | H05K 7/1445 361/730 |
| 6,795,885 B1 * | 9/2004 | deBlanc | G06F 11/2007 361/729 |
| 10,359,815 B1 | 7/2019 | Lin et al. | |
| 2004/0201972 A1 * | 10/2004 | Walesa | H01R 25/164 361/788 |
| 2006/0282599 A1 * | 12/2006 | Chiu | H05K 5/0282 710/306 |
| 2009/0109609 A1 * | 4/2009 | Lai | G06F 1/187 361/679.39 |
| 2010/0271766 A1 * | 10/2010 | Lin | G06F 1/184 361/679.02 |
| 2013/0107454 A1 * | 5/2013 | Wilke | G06F 1/188 361/694 |

(Continued)

FOREIGN PATENT DOCUMENTS

| | | |
|---|---|---|
| TW | M434413 | 7/2012 |
| TW | I590741 | 7/2017 |

*Primary Examiner* — Hung S. Bui
*Assistant Examiner* — Sagar Shrestha
(74) *Attorney, Agent, or Firm* — ScienBiziP, P.C.

(57) ABSTRACT

A storage system includes a chassis, a storage module, and a controller module. The storage module and the controller module are mounted to the chassis. The storage module includes a housing, a storage member, and an adapter plate. The storage member is fixed to the housing and is configured to store data. The adapter plate is fixed to the housing and is detachably connected to the storage member and the controller module.

20 Claims, 9 Drawing Sheets

(56) References Cited

U.S. PATENT DOCUMENTS

| | | | |
|---|---|---|---|
| 2014/0029194 A1* | 1/2014 | Hayashi | G06F 1/184 |
| | | | 361/679.48 |
| 2014/0204537 A1* | 7/2014 | Rust | H05K 7/02 |
| | | | 361/727 |
| 2016/0095246 A1* | 3/2016 | Noland | H05K 7/1489 |
| | | | 361/679.31 |
| 2016/0165742 A1* | 6/2016 | Shen | H05K 7/1487 |
| | | | 361/679.37 |
| 2016/0234962 A1* | 8/2016 | Shinsato | G11B 33/128 |
| 2017/0150635 A1* | 5/2017 | Huang | H05K 7/1492 |
| 2019/0258602 A1* | 8/2019 | Zheng | G06F 15/7867 |

* cited by examiner

STORAGE SYSTEM

FIELD

The subject matter herein generally relates to storage systems, and more particularly to a storage system capable of maintaining data transmission during replacement or maintenance of the storage system.

BACKGROUND

Generally, a controller module in a storage system transmits main signals and backup signals to storage modules through a backplane, as shown in FIG. 1. However, when the backplane needs to be repaired or is damaged, data of the storage modules are inaccessible.

BRIEF DESCRIPTION OF THE DRAWINGS

Implementations of the present disclosure will now be described, by way of embodiments, with reference to the attached figures.

DETAILED DESCRIPTION

Figure 1:
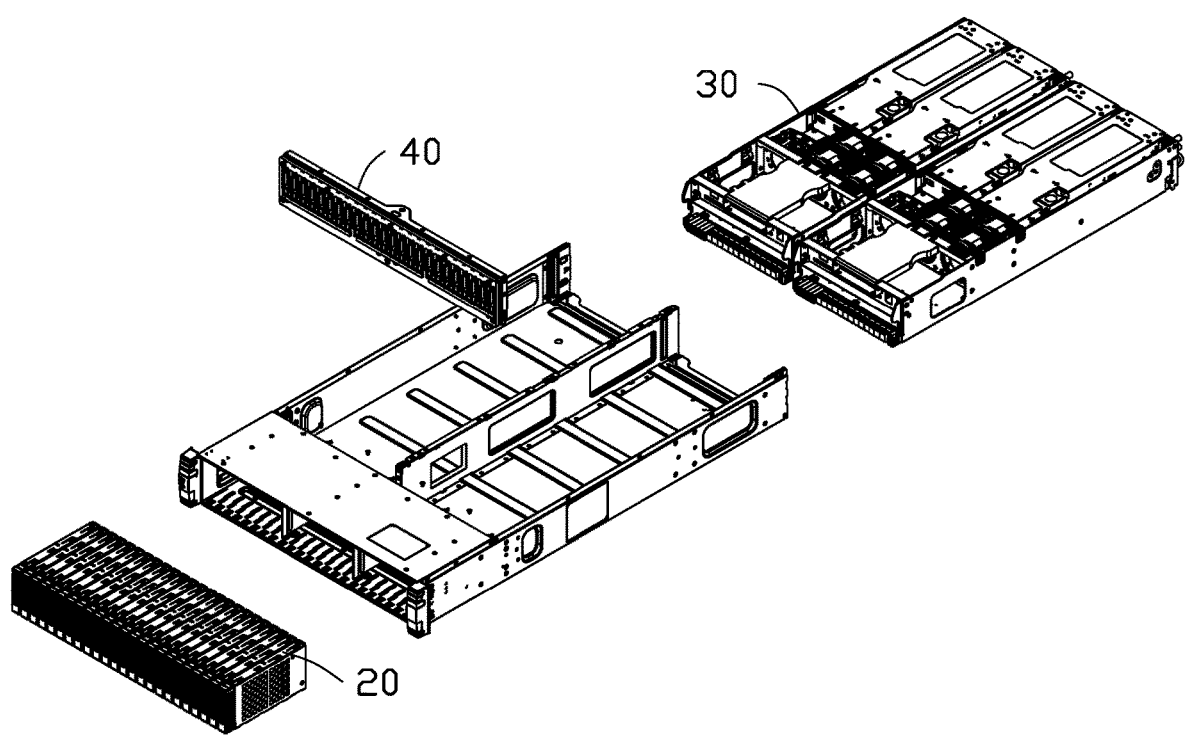
FIG. 1 is an exploded, isometric view of a storage system in the related art.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows in the related art, a storage module 20 and a controller module 30 are connected by a backplane 40. When the backplane 40 fails or needs to be repaired, the storage module 20 and the controller module 30 cannot continue to transmit data.

Figure 2:
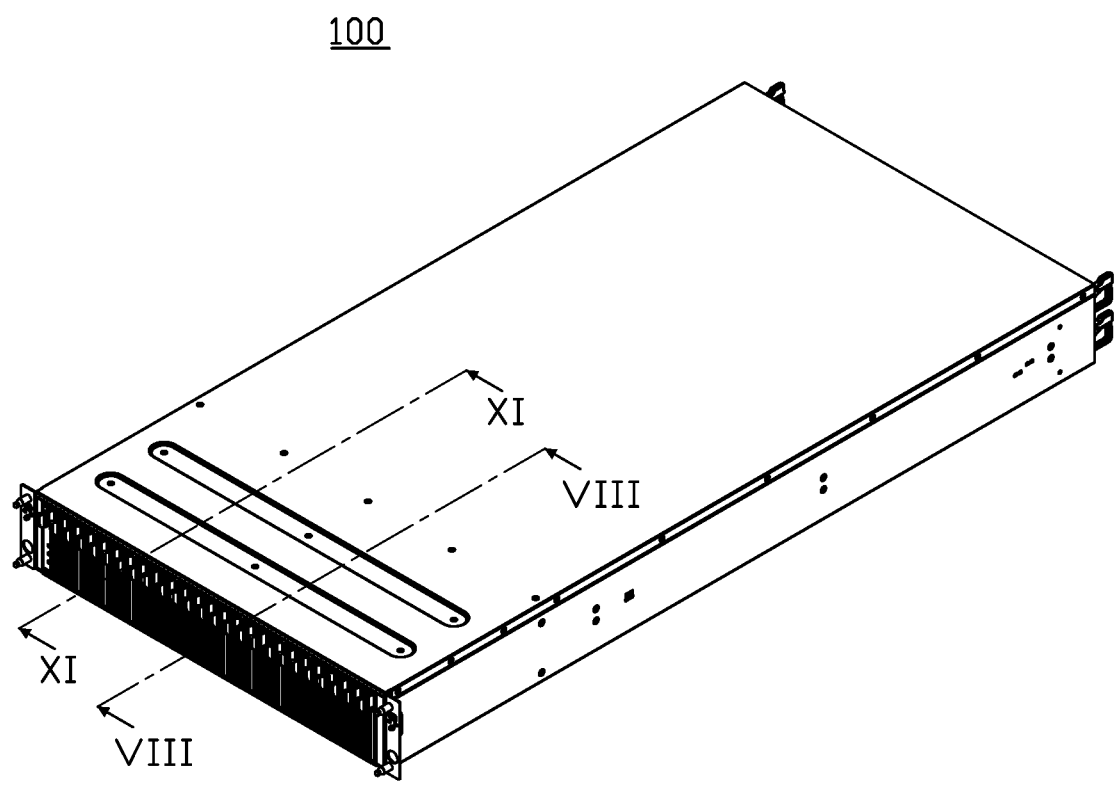
FIG. 2 is an assembled, isometric view of an embodiment of a storage system.
Figure 3:
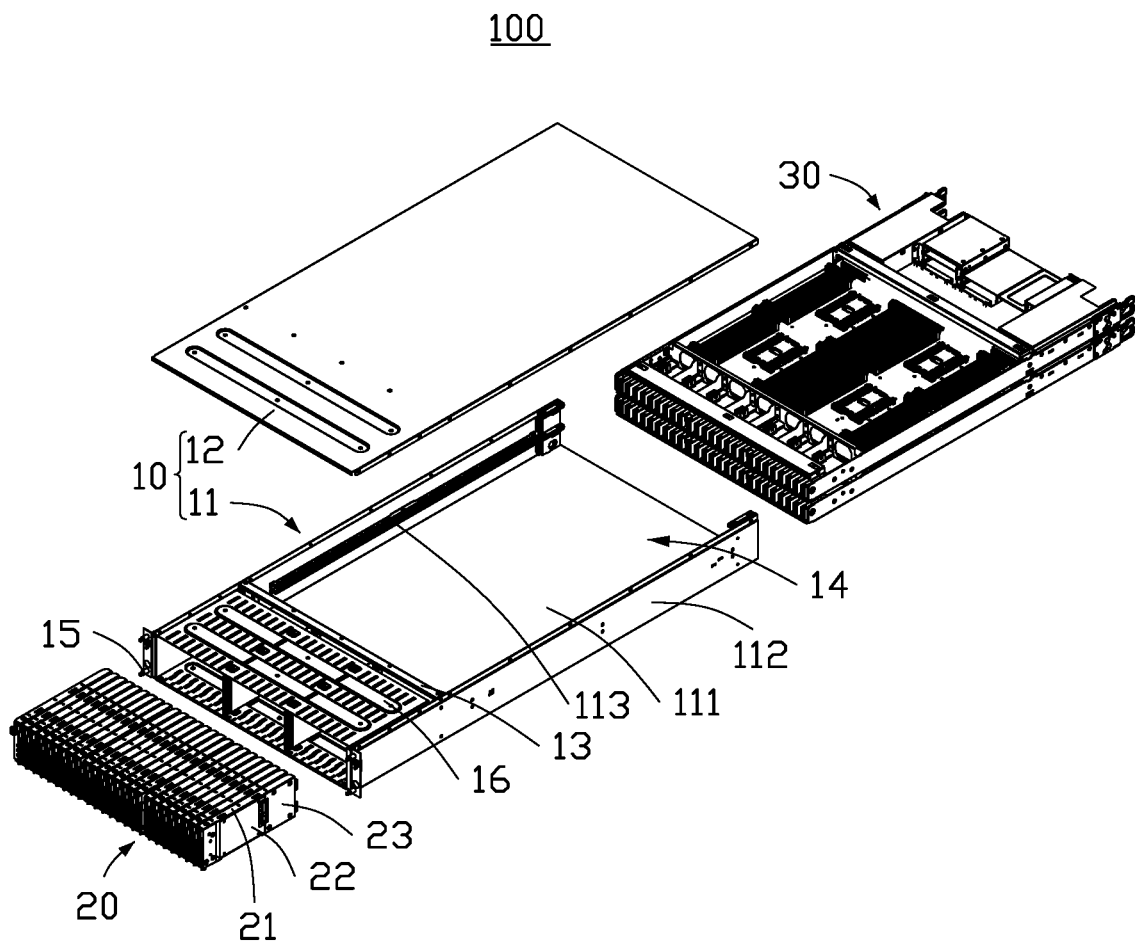
FIG. 3 is an exploded, isometric view of the storage system in FIG. 2.

FIGS. 2 and 3 show an embodiment of a storage system 100. The storage system 100 includes a chassis 10, at least one storage module 20, and at least one controller module 30. The storage module 20 and the controller module 30 are fixed in the chassis 10. The storage module 20 includes a housing 21 and a storage member 22 for storing data. The storage member 22 is fixed to the housing 21. The storage module 20 further includes an adapter plate 23 fixed to the housing 21, and the adapter plate 23 is detachably connected to the storage member 22 and the controller module 30.

Figure 4:
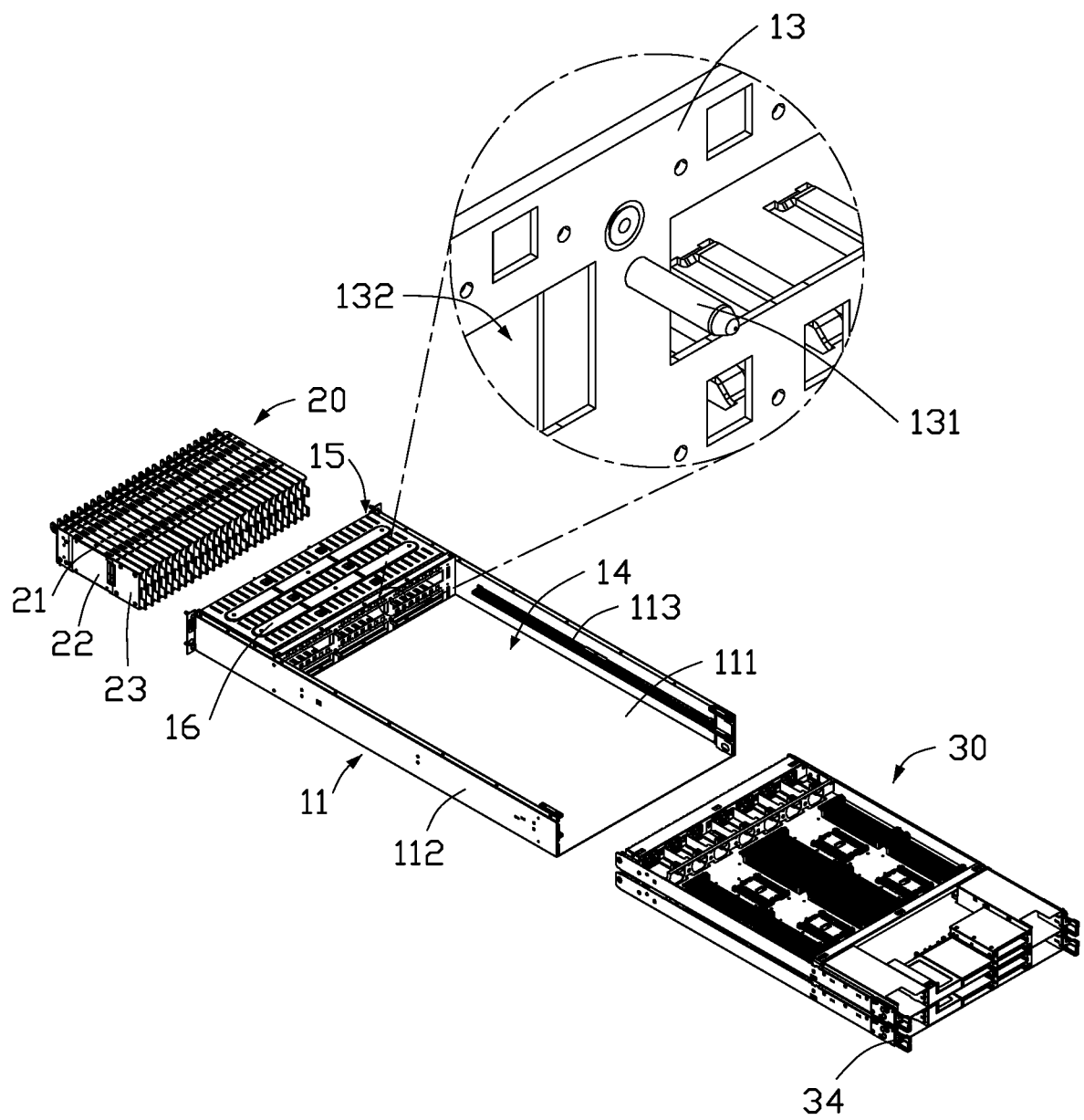
FIG. 4 is similar to FIG. 3, but showing the storage system from another angle.

Referring to FIG. 3 and FIG. 4, the chassis 10 includes a body 11 and a cover 12 detachably disposed on the body 11. The cover 12 may be fixed to the body 11 by screws, but a manner of fixing the cover 12 to the body 11 is not limited thereto. The body 11 includes a bottom plate 111 and two side plates 112. The two side plates 112 are substantially perpendicular to the bottom plate 111 and are respectively located at opposite sides of the bottom plate 111. A bracket 13 is located in the chassis 10 to partition the chassis 10 into a first receiving slot 14 and a second receiving slot 15. The storage module 20 and the controller module 30 are respectively received in the second receiving slot 15 and the first receiving slot 14.

As shown in FIG. 3, each side plate 112 includes a support portion 113 in the first receiving slot 14. If the storage system 100 includes two controller modules 30, one of the controller modules 30 can be placed on the support portion 113 to be received in the first receiving slot 14. The body 11 includes a guiding member 16 in the second receiving slot 15. One side of the guiding member 16 is connected to the bracket 13 and is configured to guide the storage module 20 into the second receiving slot 15.

As shown in FIG. 4, the bracket 13 includes a guide post 131 extending from a surface of the bracket 13 toward the first receiving slot 14. The bracket 13 defines a plurality of through holes 132. The through holes 132 are substantially evenly arranged. The storage module 20 in the second receiving slot 15 is configured to pass through the through holes 132 to connect to the controller module 30 in the first receiving slot 14. A shape and size of the through holes 132 correspond to a shape and size of the storage module 20.

Figure 5:
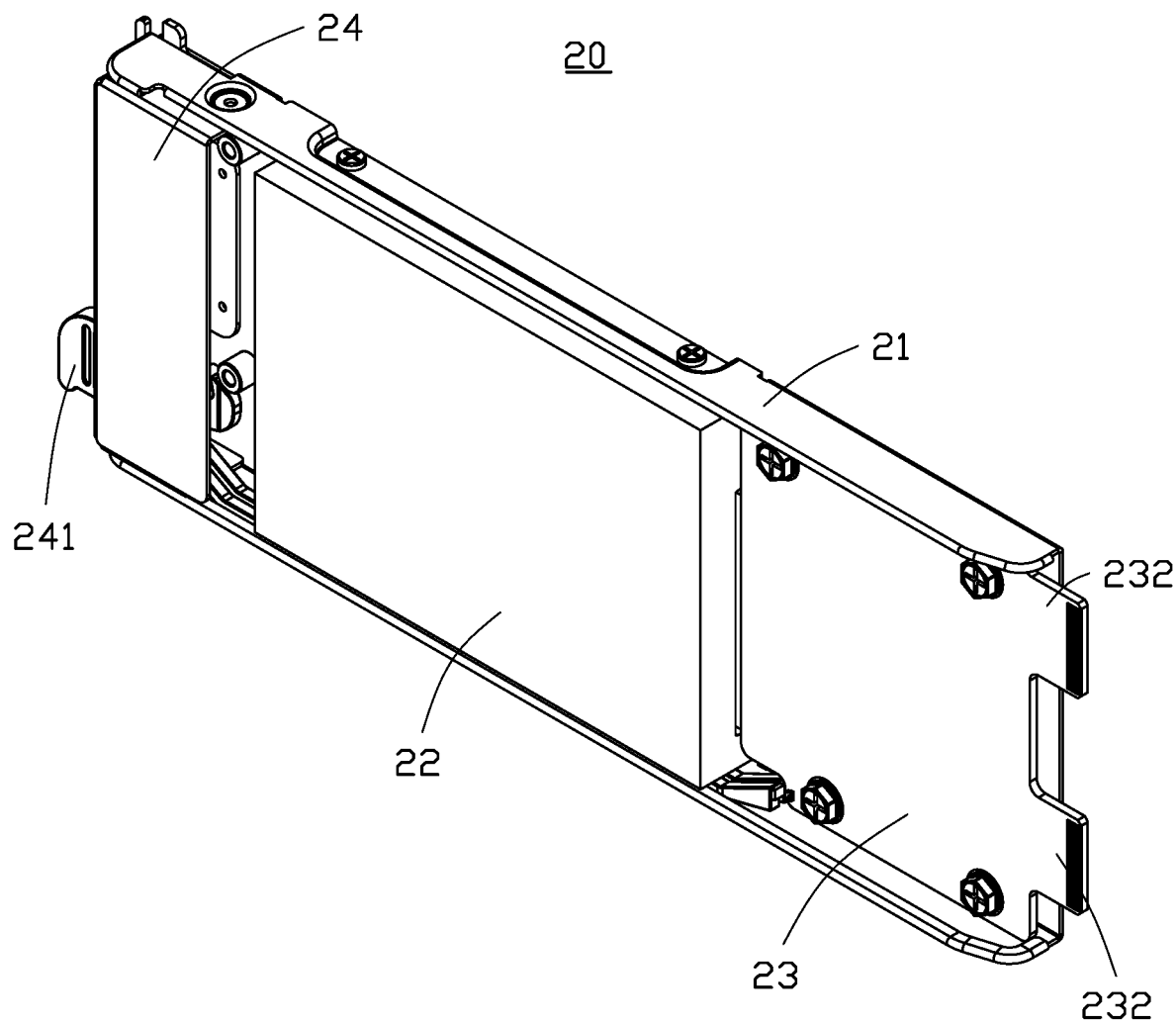
FIG. 5 is an isometric view of a storage module of the storage system.
Figure 6:
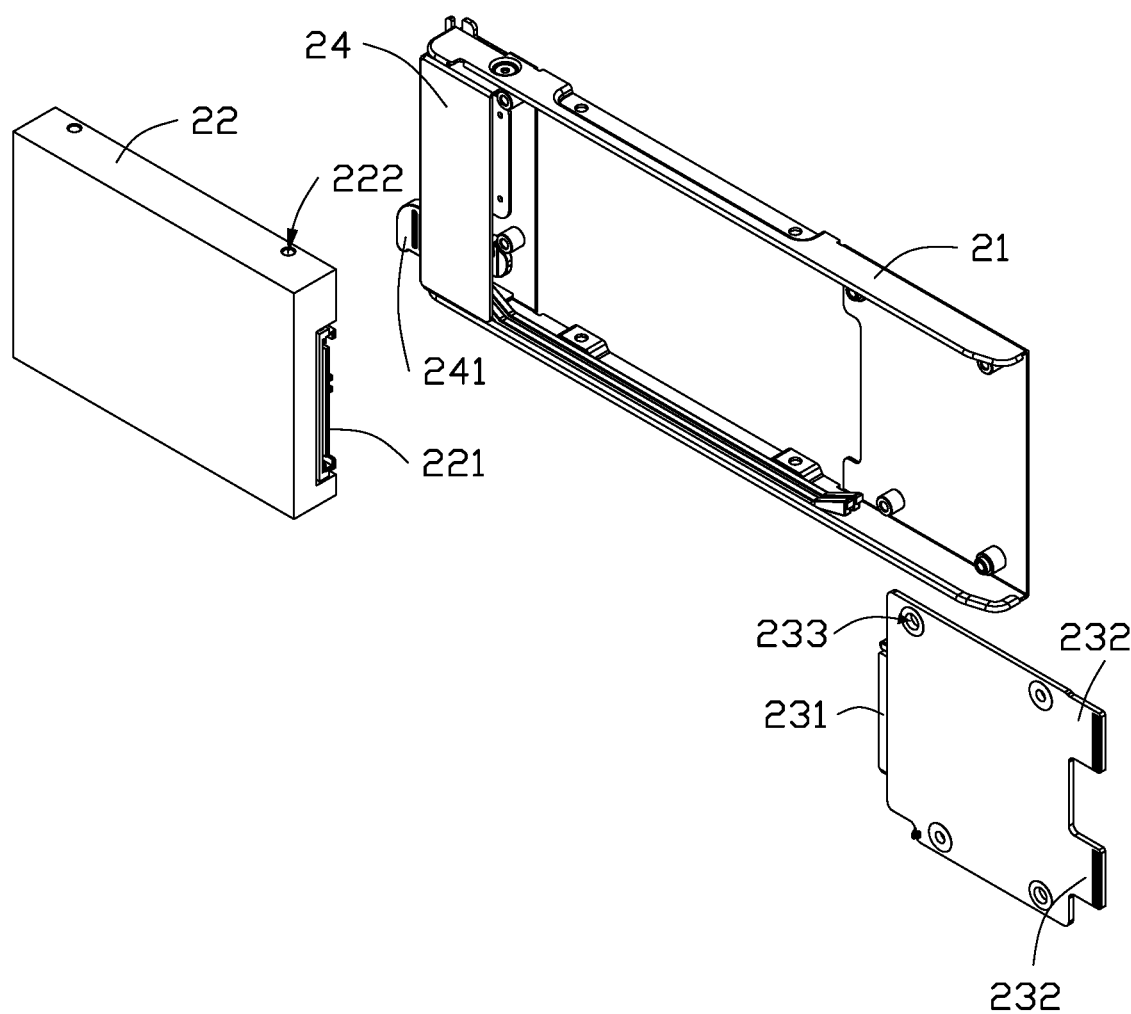
FIG. 6 is an exploded view of the storage module in FIG. 5.

As shown in FIGS. 5 and 6, the housing 21 of the storage module 20 is substantially a hollow rectangular parallelepiped structure formed by two first connecting plates 211 and two second connecting plates 212. The first connecting plates 211 are substantially perpendicularly coupled to the second connecting plates 212. The storage member 22 and the adapter plate 23 are located on the housing 21, and the storage member 22 is detachably coupled to the adapter plate 23. The storage member 22 and the adapter plate 23 are arranged side by side on the first connecting plate 211 between the two second connecting plates 212.

Specifically, the storage member 22 is received in the housing 21. The storage member 22 may be a 2.5-inch hard disk, but in other embodiments, the storage member 22 may be replaced with other sizes of hard disks or other components having a storage function. One end of the storage member 22 includes a socket 221, and the storage member 22 is coupled to the adapter plate 23 through the socket 221. The storage member 22 defines at least one mounting hole 222. The storage member 22 may be mounted in the housing 21 by screws screwing through the mounting portion 222.

The adapter plate 23 is received in the housing 21 and includes a second connector 231 located at an end of the adapter plate 23. The second connector 231 is configured to be inserted into the socket 221 to connect the storage member 22 to the adapter plate 23. The adapter plate 23 includes at least one connecting portion 232. In one embodiment, the connecting plate 23 includes two connecting portions 232, and the two connecting portions 232 are configured to protrude out of the housing 21. Specifically, the connecting portions 232 protrude through the through holes 132 of the bracket 13 to connect to the controller module 30. In one embodiment, the adapter plate 23 is a printed circuit board. The adapter plate 23 defines at least one mounting hole 233, and the adapter plate 23 may be fixed to the housing 21 by a screw screwing through the mounting hole 233. In other embodiments, a quantity of the connecting portions 232 may be changed according to a quantity of connections with the controller module 30. In other embodiments, the connecting portions 232 do not protrude out of the housing 21, and the controller module 30 protrudes through the through holes 132 to connect to the connecting portions 232.

The storage module 20 further includes an operation portion 24 fixed to the housing 21. The operation portion 24 and the adapter plate 23 are respectively located at two ends of the housing 21. The operation portion 24 includes a handle 241 protruding outside of the housing 21. The handle 241 is configured to be pulled to pull the storage module 20 out of the chassis 10.

Figure 7:
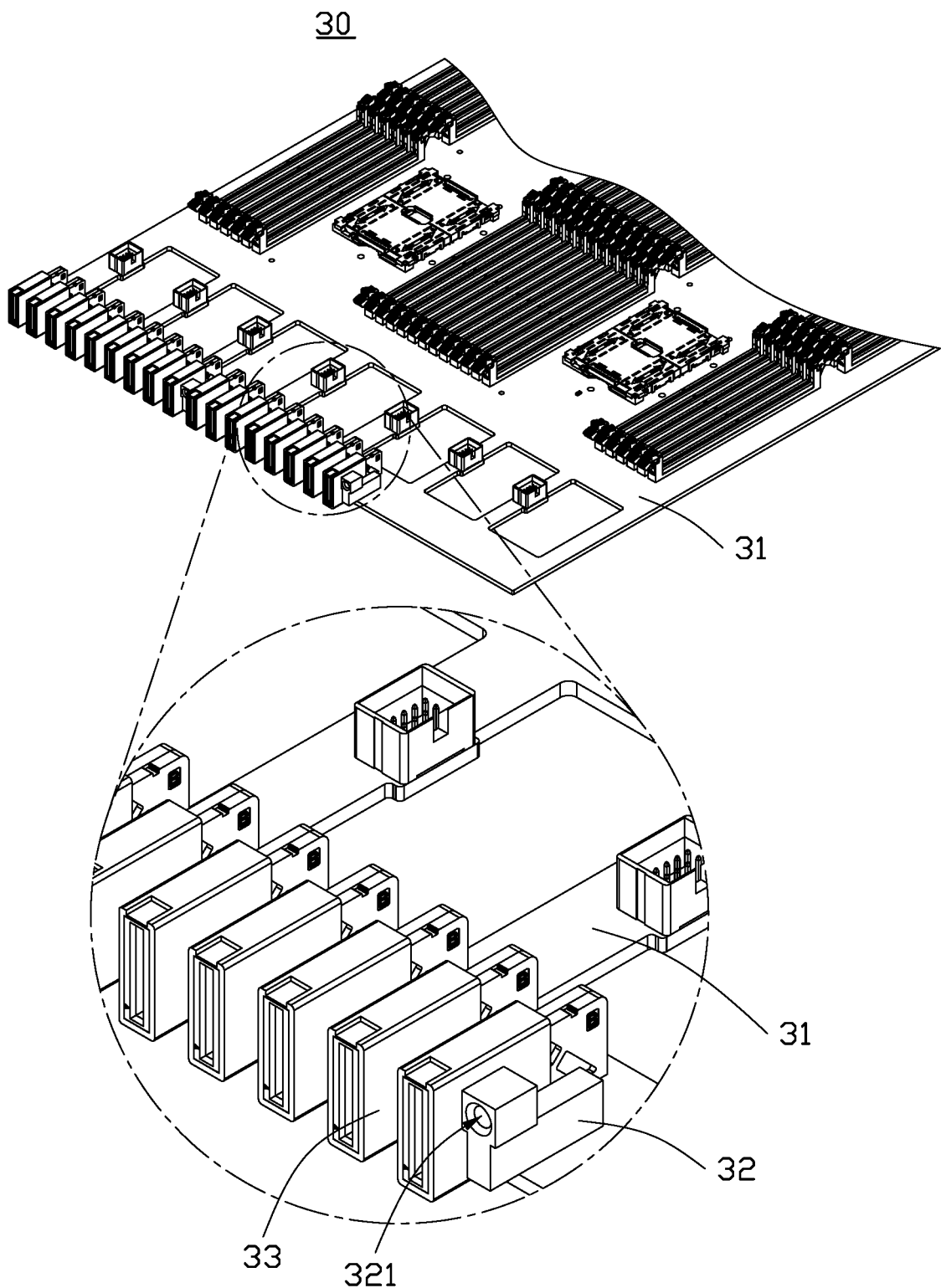
FIG. 7 is a partial close-up view of a controller module of the storage system.

As shown in FIG. 4 and FIG. 7, the controller module 30 includes a motherboard 31 and a fixing portion 32. The fixing portion 32 is located at an end of the motherboard 31 adjacent to the bracket 13. The fixing portion 32 defines a receiving hole 321. When the controller module 30 is received in the first receiving slot 14, the guide post 131 is received in the receiving hole 321. The controller module 30 further includes at least one first connector 33 located at the end of the motherboard 31 adjacent to the bracket 13. When the storage module 20 and the controller module 30 are connected, the adapter plate 23 is connected to the first connector 33 by the corresponding connecting portion 232. Each first connector 33 is configured to connect to one connecting portion 232. When there are two controller modules 30 stacked on top of each other, the two connecting portions 232 are configured to connect to the two controller modules 30, respectively The fixing portion 32 and the first connector 33 are both located at the same end of the motherboard 31, and the first connector 33 is electrically coupled to the motherboard 31. In one embodiment, the bracket 13 includes four guide posts 131 symmetrically arranged. Correspondingly, the controller module 30 includes four fixing portions 32. In other embodiments, a quantity and arrangement of the guide posts 131 and the fixing portions 32 can be changed according to needs.

The controller module 30 includes a handle 34 at an end of the controller module 30 opposite the end where the fixing portion 32 is located. The handle 34 is configured to be pulled to pull the controller module 30. It should be understood that the controller module 30 further includes other control components located on the motherboard 31 which will not be further described herein.

Figure 8:
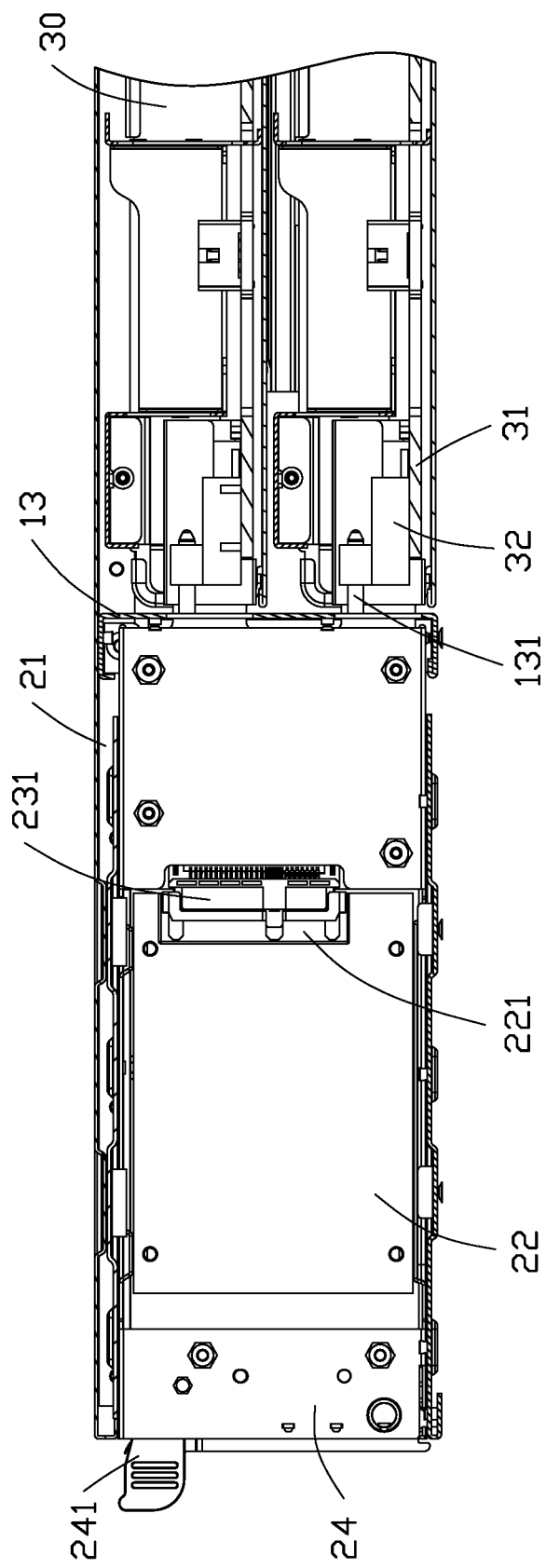
FIG. 8 is a cross-sectional view taken along line VIII-VIII in FIG. 2.
Figure 9:
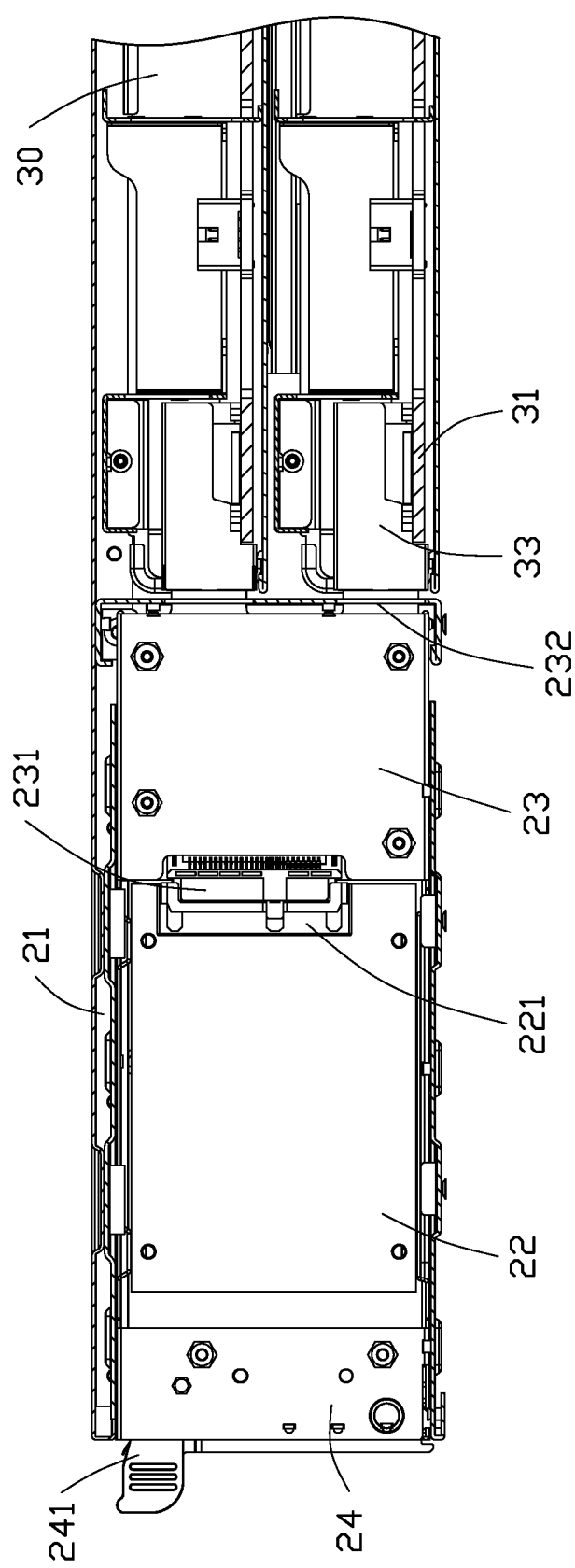
FIG. 9 is a cross-sectional view taken along line XI-XI in FIG. 2.

In one embodiment, the storage system 100 includes a plurality of storage modules 20 and two controller modules 30. The two controller modules 30 are stacked on top of each other in the first receiving slot 14, such that a first one of the controller modules 30 is placed on the bottom plate 111, and a second one of the controller modules 30 is placed on the support portion 113. As shown in FIG. 8, the guide posts 131 are engaged with the fixing portions 32. The storage modules 20 are received in the second receiving slot 15 and arranged side by side parallel to the side plates 112. The adapter plates 23 are parallel to the side plates 112. After the guide posts 131 are engaged with the fixing portions 32, the connecting portions 232 are more accurately connected to the first connectors 33 through the through holes 132, as shown in FIG. 9. Finally, the cover 12 is covered on the body 11. Thus, the storage module 20 and the controller module 30 can realize bidirectional transmission through the adapter plate 23.

It can be understood that in other embodiments, a quantity of the controller modules 30 can be changed according to needs, as long as a quantity of the connecting portions 232 of each storage module 20 is set to the same quantity of the controller modules 30.

In summary, the storage modules 20 are arranged side by side on the chassis 10, and each of the storage modules 20 is connected to the controller module 30 through the adapter plate 23. Thus, even if one of the storage modules 20 needs to be repaired or fails, the other storage modules 20 can continue to be connected to the controller module 30 to prevent interruption of data during transmission. In addition, since the through holes 132 defined in the bracket 13 are evenly arranged, when the storage module 20 is placed on the body 11, the storage modules 20 are evenly arranged side by side, so that heat generated by the storage modules 20 or the controller module 30 during operation can be better dissipated to prevent overheating of the storage system 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A storage system comprising:
   a chassis;
   at least one storage module mounted to the chassis; and
   at least one controller module mounted to the chassis;
   wherein:
   the storage module comprises a housing, a storage member, and an adapter plate;
   the storage member is fixed to the housing and is configured to store data;
   the adapter plate is fixed to the housing and is detachably connected to the storage member and the controller module;
   the adapter plate comprises at least one connecting portion extending away from the storage member;
   the controller module comprises a motherboard and a first connector on the motherboard; and the storage module is connected to the controller module by the connecting portion of the adapter plate directly connecting to the first connector.

2. The storage system of claim 1, wherein:
the chassis comprises a bottom plate and two side plates;
the two side plates are perpendicular to the bottom plate; and
the adapter plate is parallel to the side plates.

3. The storage system of claim 2, wherein:
the motherboard is parallel to the bottom plate.

4. The storage system of claim 1, wherein:
the chassis comprises a bracket;
the bracket defines a through hole;
the bracket partitions the chassis into a first receiving slot and a second receiving slot;
the storage module and the controller module are respectively received in the second receiving slot and the first receiving slot; and
the storage module passes through the through hole to connect to the controller module.

5. The storage system of claim 4, wherein:
the bracket comprises a guide post;
the controller module comprises a fixing portion; and
the guide post is configured to engage with the fixing portion.

6. The storage system of claim 4, wherein:
a guiding member is arranged in the second receiving slot;
one side of the guiding member is connected to the bracket and is configured to guide the storage module into the second receiving slot.

7. The storage system of claim 1, wherein:
the storage module further comprises an operation portion;
the operation portion and the adapter plate are respectively located at two ends of the housing;
the operation portion comprises a handle protruding out of the housing;
the handle is configured to be pulled to pull the storage module.

8. The storage system of claim 1, wherein:
the storage member comprises a socket;
the adapter plate comprises a second connector; and
the adapter plate is connected to the storage member by the second connector inserting into the socket.

9. The storage system of claim 1, wherein:
each of the first connector is configured to connect to one of the connecting portion.

10. A storage system comprising:
a chassis;
at least one storage module mounted to the chassis; and
at least one controller module mounted to the chassis;
wherein:
the storage module comprises a housing, a storage member, and an adapter plate;
the storage member is fixed to the housing and is configured to store data;
the adapter plate is fixed to the housing and is detachably connected to the storage member and the controller module;
the adapter plate comprises at least one connecting portion; and
a number of the at least one connecting portion is equal to a number of the at least one controller module;
the at least one connecting portion extends away from the storage member;
the controller module comprises a motherboard and a first connector on the motherboard; and
the storage module is connected to the controller module by the connecting portion of the adapter plate directly connecting to the first connector.

11. The storage system of claim 10, wherein:
the chassis comprises a bottom plate and two side plates;
the two side plates are perpendicular to the bottom plate; and
the adapter plate is parallel to the side plates.

12. The storage system of claim 11, wherein:
the motherboard is parallel to the bottom plate.

13. The storage system of claim 10, wherein:
the chassis comprises a bracket;
the bracket defines at least one through hole;
the bracket partitions the chassis into a first receiving slot and a second receiving slot;
the at least one storage module and the at least one controller module are respectively received in the second receiving slot and the first receiving slot; and
the at least one connecting portion of the storage module passes through the at least one through hole to connect to the first connector of the controller module.

14. The storage system of claim 13, wherein:
the bracket comprises a guide post;
the controller module comprises a fixing portion; and
the guide post is configured to engage with the fixing portion.

15. The storage system of claim 14, wherein:
the storage module further comprises an operation portion;
the operation portion and the adapter plate are respectively located at two ends of the housing;
the operation portion comprises a handle protruding out of the housing;
the handle is configured to be pulled to pull the storage module.

16. The storage system of claim 15, wherein:
the storage member comprises a socket;
the adapter plate comprises a second connector; and
the adapter plate is connected to the storage member by the second connector inserting into the socket.

17. The storage system of claim 16, wherein:
a plurality of storage modules are arranged side by side in the second receiving slot;
two controller modules are stacked on top of each other in the first receiving slot;
each of the plurality of storage modules comprises two connecting portions; and
the two connecting portions of each of the plurality of storage modules is connected to the two controller modules, respectively.

18. The storage system of claim 17, wherein:
the chassis comprises a support portion located on each of the two side plates;
a first one of the two controller plates is placed on the bottom plate; and
a second one of the controller plates is placed on the support portions.

19. The storage system of claim 13, wherein:
a guiding member is arranged in the second receiving slot;
one side of the guiding member is connected to the bracket and is configured to guide the storage module into the second receiving slot.

20. The storage system of claim 10, wherein:
each of the first connector is configured to connect to one of the connecting portion.

* * * * *